(12) United States Patent
Mickievicz et al.

(10) Patent No.: US 7,218,530 B2
(45) Date of Patent: May 15, 2007

(54) ENHANCED BLIND HOLE TERMINATION OF PIN TO PCB

(75) Inventors: Scott Keith Mickievicz, Elizabethtown, PA (US); John Edward Knaub, Etters, PA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 51 days.

(21) Appl. No.: 11/179,097

(22) Filed: Jul. 12, 2005

(65) Prior Publication Data

US 2005/0263322 A1    Dec. 1, 2005

Related U.S. Application Data

(63) Continuation-in-part of application No. 10/461,840, filed on Jun. 13, 2003, now Pat. No. 6,963,494.

(51) Int. Cl.
   *H05K 1/11*   (2006.01)
   *H05K 1/14*   (2006.01)

(52) U.S. Cl. ............ 361/795; 361/785; 257/774; 438/620; 29/846; 29/847

(58) Field of Classification Search ............ 361/792, 361/794–795, 782–784, 772–774; 257/678, 257/774; 174/252, 266, 260–264; 438/620, 438/209; 29/831, 846, 847
See application file for complete search history.

(56) References Cited

U.S. PATENT DOCUMENTS

| | | |
|---|---|---|
| 3,301,939 A | 1/1967 | Krasnow |
| 3,875,479 A | 4/1975 | Jaggar |
| 5,046,957 A | 9/1991 | Millhimes |
| 5,363,280 A | 11/1994 | Chobot et al. |
| 5,543,586 A | 8/1996 | Crane, Jr. et al. |
| 6,522,014 B1 | 2/2003 | Egitto et al. |

*Primary Examiner*—Tuan Dinh
*Assistant Examiner*—Hung S. Bui
(74) *Attorney, Agent, or Firm*—Peter Van Winkle

(57) ABSTRACT

Tails (20) projecting from an electrical component (12) that lies on a circuit board surface, are terminated to traces on a multi-layer circuit board (14) in a manner that minimizes the disadvantages of long through hole soldering and of surface mount techniques. A blind hole is drilled and plated to form a shallow well (70). The well is filled with a soldering composition (130). A tail (20) is projected downward into the soldering composition with the extreme tip of the tail lying above the bottom of the hole, and the soldering composition is heated to solder the tail to the hole plating.

9 Claims, 3 Drawing Sheets

ENHANCED BLIND HOLE TERMINATION OF PIN TO PCB

CROSS-REFERENCE

This is a continuation-in-part of U.S. patent application Ser. No. 10/461,840 that was filed Jun. 13, 2003 now U.S. Pat. No. 6,963,494.

BACKGROUND OF THE INVENTION

Components that lie on a circuit board typically have leads or tails that must be soldered to traces on the circuit board. One technique for mounting the tails includes drilling holes through the circuit board, plating the holes and then fixing the tails in the holes. The tail can be a compliant pin which is forced into the hole in an interference fit, or can be soldered in place with the solder joined to tail portions that project from opposite ends of the hole. When a multi-layer circuit board assembly is used, the through holes extending the board assembly are long and tails to be soldered in the holes must be long. This results in considerable capacitance between the plated walls of the hole and close traces on the laminates, or layers of the assembly, and results in increased crosstalk and decreased signal strength.

Another technique for soldering component tails to traces on a circuit board, is the SMT (surface mount technique) method, wherein the tails touch circuit board traces that form solder pads, and are soldered thereto. In order to achieve reliable solder joints, the tails should each touch the corresponding solder pad. This requires close tolerances and/or resilient tails. The SMT technique results in solder joints that are mechanically weak against shear forces that tend to move the tails parallel to the plane of the board upper face and against pull up forces.

A technique for soldering component tails to platings or other traces on a multilayer circuit board, which avoided the disadvantages of high capacitive load for through-hole soldering, and which avoided the disadvantages of weakness and close tolerances or resilient tails for SMT, would be of value.

SUMMARY OF THE INVENTION

In accordance with one embodiment of the present invention, a solder connection is provided between a lead or tail of a component lying on a multi-layer circuit board arrangement and a plating on the arrangement, and a method for producing such solder connection, which avoids the high capacitance loading, low shear and tension strength, and the need for resilient or precision tails of the prior art. In a multi-board arrangement, a blind hole is formed that extends through only a portion of the thickness of a multi-layer circuit board. The blind hole is plated to form a solder well whose bottom is formed by the bottom of the hole. The tail of a component is inserted down into the hole and soldered in place thereat, as by a solder paste that was previously placed in the well or around the tail. The portion of the tail lying in the circuit board is short, being less than the thickness of the multi-layer board, to avoid a significant capacitive load. However, a considerable length of the tail, such as a length that is about equal to its diameter, is firmly soldered in and above the hole, so the tail resists considerable force tending to break the solder connection. The tails do not have to be formed with high precision, since a rugged connection is achieved with tails that project different distances into the solder wells.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
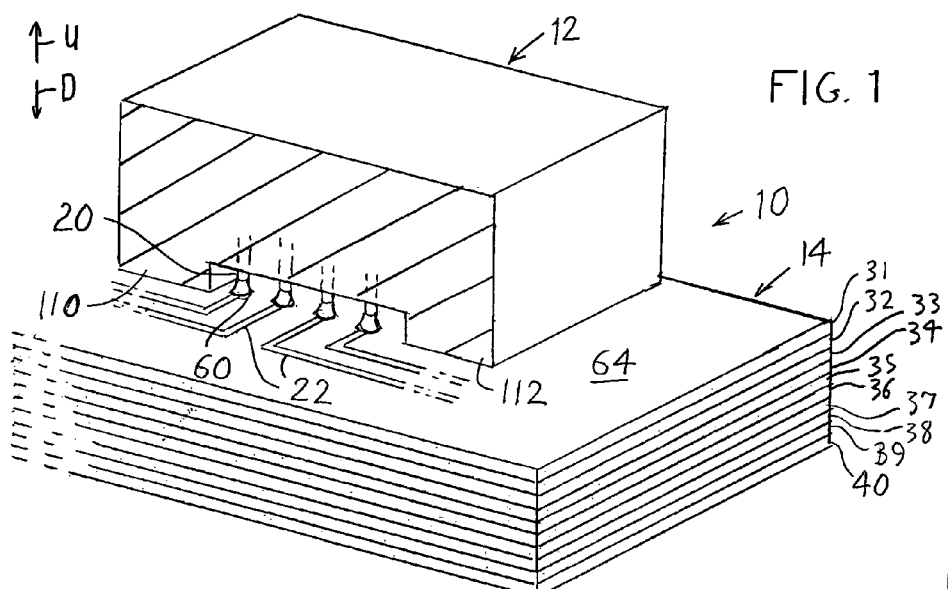
FIG. 1 is a partial isometric view of a component lying on a multi-layer circuit board assembly, and having tails soldered to traces on an uppermost first board of the assembly.
Figure 3:
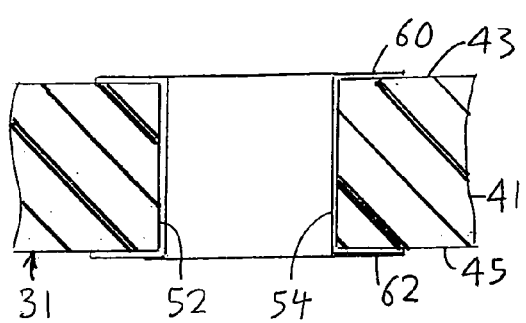
FIG. 3 is a sectional view of a portion of the first board, shown after a first step of the method of the invention.

FIG. 1 illustrates a termination system 10 of the present invention, wherein a component 12 that lies on a multi-layer circuit board assembly 14 has component pins, or leads, or tails 20 that must be soldered to traces 22 on a first layer 31 of the circuit board assembly. The particular circuit board assembly 14 includes ten layers 31–40 that lie in a facewise stack wherein each layer lies facewise adjacent to one or two other layers, to form a facewise stack of layers. Up and down directions are indicated by arrows U and D for the particular orientation of the component and board assembly illustrated in the figures, although it should be understood that the board assembly and component can lie in any orientation. As shown in FIG. 3, each layer such as 31 includes a plate 41 of insulative material. Most or all of the layers also include traces such as 60, 62 on one or both faces 43, 45 of the plate, the traces being formed of a film of conductive material.

Figure 2:
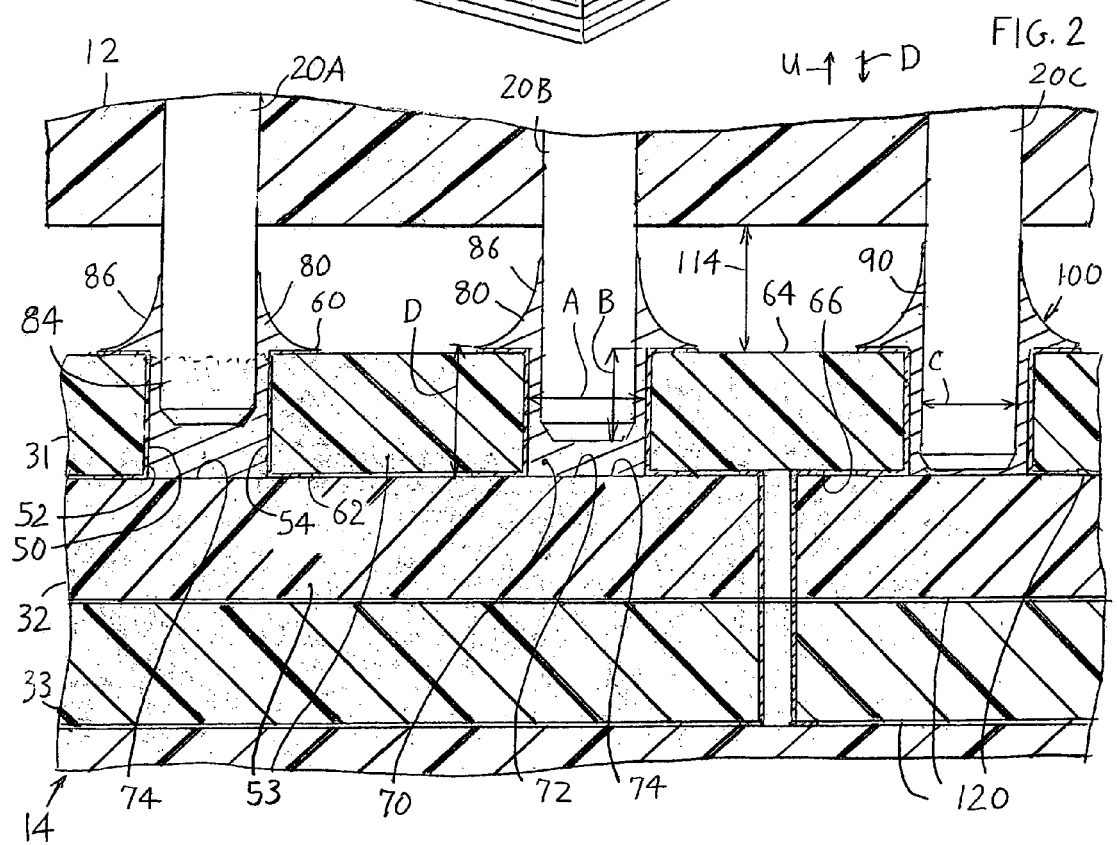
FIG. 2 is an enlarged sectional view of a portion of the component and multi-layer circuit board assembly of FIG. 1.

FIG. 2 shows that the first or uppermost layer 31 has walls forming a plated hole 50. The layer hole 52 within the plating is preferably formed, as by drilling with a drill or boring tool or laser, in the dielectric or insulative substrate 53 that forms most of the layer. After drilling, a plating is applied that includes a hole plating portion 54 and top and bottom face traces parts 60, 62 that lie on upper and lower faces 64, 66 of the substrate of the first layer. As shown in FIG. 1, the upper face trace parts 60 merge with the rest of each trace 22 that extends from a hole to other circuitry on the circuit board.

Each hole 50 of FIG. 2 forms a solder well 70 whose well lower wall 72 is formed by an upper face 74 of the second layer 32. Thus, the well has bottom and side walls, so it can contain solderable material during a soldering operation when the solder is flowable. A lower tail end portion 84 of each component tail projects into one of the plated holes 50 and is soldered by the solder 80 lying in the well and displaced and attracted by capillary action to lie above the well. In the soldering operation, the solder forms a fillet 86 that adheres to the top face plating part 60 and to portions 90 of the tail.

The solder connection 100 formed between the tail end portion 84 that projects into and moderately above the solder well 70 and the plating on the walls of the hole and on the upper surface of the first layer, provides a rugged joint of minimal capacitance. The small capacitance is due to the short length B of the tail that lies within the multi-layer circuit board assembly 14, the length B preferably being no greater than the thickness D of the first layer 31. The very small thicknesses of the face traces 60, 62 can be considered part of the thickness D of the board. The resistance of the tails to upward U pullout is much greater than for a surface mount solder connection, and almost as great as that for a very long tail that extends through the entire thickness of the multi-board circuit board assembly 14. The resistance to damage when the component tends to move laterally L relative to the circuit board assembly is much higher than for an SMT connection and almost as high as for a tail that extends completely through the circuit board assembly.

The component 12 shown in FIG. 1 has standoffs 110, 112 that leave a space 114 (FIG. 2) above the first layer upper face 64. This leaves room for the solder fillets 86 and leaves room for washout fluid to clean the solder connections and possibly to allow observance of the solder connections for defects.

The length of each tail 20 should be about the same, but with large tolerances allowed. In FIG. 2, the tails 20A, 20B, 20C are of different lengths. The tail 20A extends a minimal distance into the hole 50, of slightly more than half the height of the hole, and is about the shortest tail. The tail 20B extends along most of the depth of the hole. The tail 20C extends almost to the bottom of the hole, and is about the longest tail within tolerances. All of the tails lengths 20A–20C provide a rugged connection.

In a system that applicant has designed, the insulative plate of each layer has a thickness of 1.25 millimeters, and each complete layer has a thickness D of about 1.30 mm. Each hole 50 has a diameter A of 1.25 mm, which is about the same as the thickness of the layer. Each tail has a width C slightly smaller than the hole diameter, to allow solder to extend all along the depth of the hole between the tail and the plated walls of the hole, with the tail width C being about one millimeter. The tolerances in tail lengths are ±0.25 mm. The faces of the layers carry signal traces and/or ground planes. The layers are held together by epoxy which is shown at 120.

Figure 4:
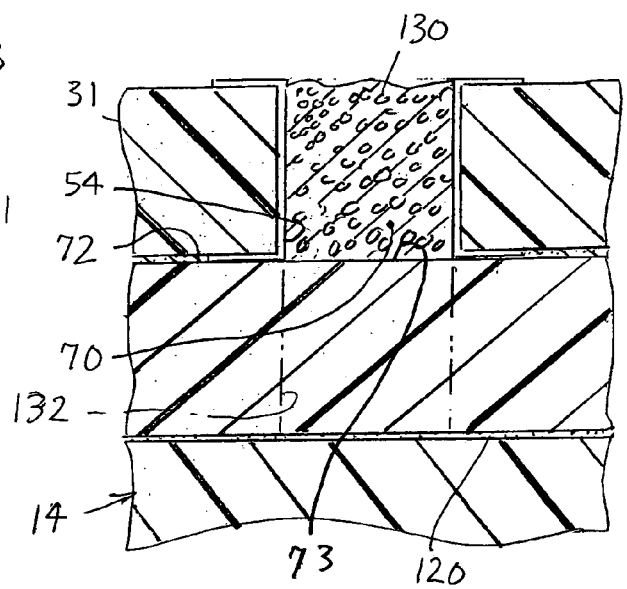
FIG. 4 is a sectional view of the first board portion of FIG. 3 and a portion of the rest of the multi-layer circuit board assembly, and with solder paste lying in a well formed in the first circuit board hole.

FIG. 3 shows a first step in the construction of the termination system. A hole 52 is formed in the first layer 31 and a plating is applied at 54, 60 and 62 to cover the walls of the hole and form trace parts of the top and bottom faces of the layer. Some of the traces such as 60 extend, as shown at 22 in FIG. 1, along the layer to connect the tail 20 to circuit components (which may be connectors) on the board. After the plating process, the layer 31 of FIG. 4 is assembled in a stack of layers 14, that may be held together with a bonding material such as epoxy 120. Then, a quantity 130 of solder paste is placed in the solder well 70 that is formed between the plated walls 54 of the hole and the upper face 72 of the second layer 32 which forms a well bottom 73. Of course, the second layer is not perforated under the well (unless the well extends through the second layer). The solder paste 30 can include multiple tiny balls of solder in a solder flux, or tiny donuts or tubes of solder paste initially placed around the tails, etc. Although applicant shows a solder well 70 extending through one layer it is also possible to form a well 132 that extends through two or more layers, though it does not extend through most of the layers. A solder well can extend through a plurality of layers in order to reach traces on a layer that lies deep under the top of the board assembly.

Figure 5:
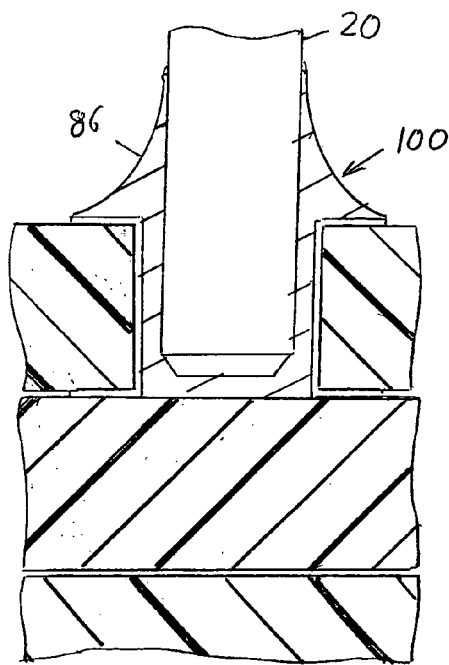
FIG. 5 is an enlarged view of a portion of a component tail and the apparatus of FIG. 4, after the tail has been soldered in place.

In FIG. 5, a component tail 20 has been pressed down into the solder paste, and heat has been applied to melt the solder paste and form the solder joint 100 that includes solder in the hole and the solder fillet 86.

Figure 6:
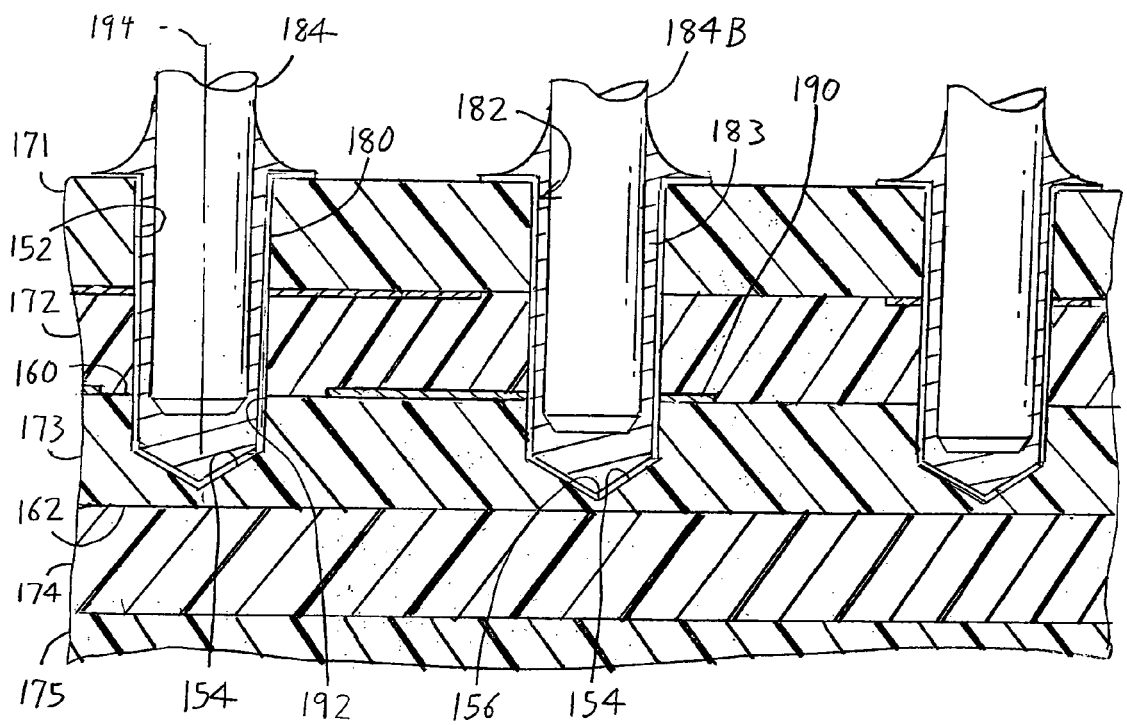
FIG. 6 is an enlarged view of a component tail fully installed in a portion of a multi-layer circuit board, in accordance with another embodiment of the invention.

FIG. 6 illustrates another system in which a multi-layer circuit board assembly 150 has formed blind holes 152 with bottom ends 154, wherein at least some of the bottom ends have extreme lower ends 156 that lie between the top and bottom surfaces 160, 162 of a layer 173 of the board assembly 150. In this system, the board assembly 150 is assembled by bonding together layers 171–175. The formed holes such as 152 are formed by drilling or are otherwise formed to extend through one or more layers. Then, each formed hole 152 is plated with a plating 180 to form a plated hole 182. Solder 183 is placed in the plated holes or on the component tail 184, the component tail is inserted into the plated hole, and the solder is melted to form a solder joint 186.

In FIG. 6 the particular component tail 184 is electrically connected through the solder and plating to a circuit board trace 190 on the lower face of the second layer 172. Usually, there are a plurality of traces on a surface of one layer. The forming of a hole through more than one layer provides a longer hole than a hole extending through only the first layer 171, although it results in slightly greater capacitance if the hole does not extend through most of the layers. The conical lower end 154 of each blind formed hole 152 is a result of drilling. A milling tool could be used to bore holes with flat bottoms. The "bottom" 154 of the hole is where the hole wall extends by many (at least 7) degrees from the sides 192 of the hole as seen in a sectional view taken on the hole axis 194. In any case, by not requiring the bottom of the holes to lie precisely at the top of a layer of the multi-layer assembly, drilling or even boring can be accomplished while requiring only moderate precision.

Figure 7:
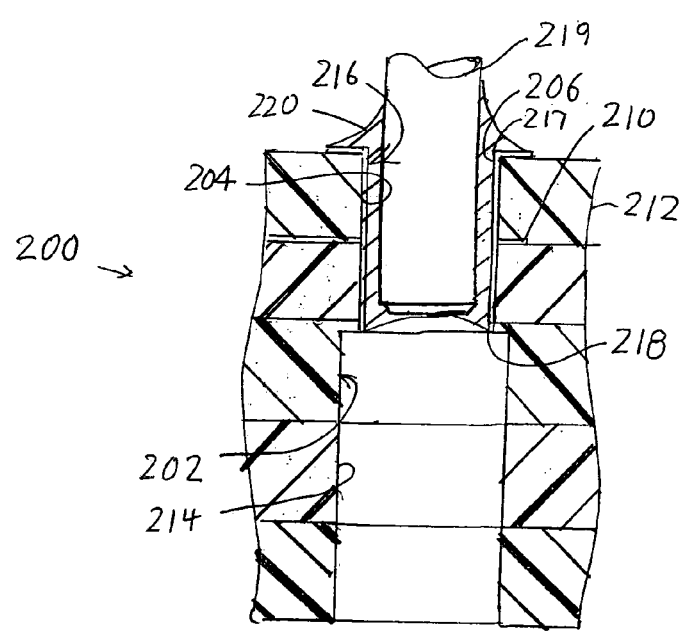
FIG. 7 is an enlarged sectional view of a component tail in stalled in a multi-layer circuit board, in accordance with another embodiment of the invention.

FIG. 7 illustrates another system in which a multi-layer circuit board assembly 200 has through holes 202. Upper portions 204 of the through holes are plated with a plating 206 that is electrically connected to a trace 210 at the bottom of a layer 212. Lower portions 214 of the holes are not plated. The upper hole portions and the plating 206 form plated holes 216 that extend between points 217, 218. A component tail 219 and solder with flux are placed in the hole and heated to form a solder joint 220. The solder will not wick down below the bottom 218 of the plating of the plated hole.

To construct the system of FIG. 7, the upper hole portions 204 are drilled from the top of the board assembly and the upper hole portions are plated. The lower hole portions 214 are then drilled up from the bottom of the stack. The lower hole portions 214 serve no purpose other than an attempt to avoid the patent.

Although terms such as "top", "bottom", etc. have been used to describe the invention as it is illustrated, the invention can be used in any orientation with respect to the Earth.

Thus, the invention provides a termination system that includes the combination of a component and a multi-layer circuit board assembly. The invention provides much of the high strength previously supplied by component tails that extend completely through the circuit board assembly, while avoiding the high capacitance, and provides many of the advantages of SMT (surface mount technology) soldering of low capacitance while providing further advantages of high strength. A plated hole extends only partially through the circuit board assembly, and may extend through only one layer (which may be the uppermost layer during manufacture). The plated hole forms a well with a well bottom formed by the upper face of the next layer in the stack or by a wall bored (e.g. drilling) partially through a layer. A solderable composition such as a solder paste is placed in the well (possibly with the tail) and a component tail is placed in the well and soldered in place. The invention allows the use of uninterrupted routing traces on layers below the top one or two layers, and uses a minimum of solder for easy melting, in addition to the low capacitive coupling and other advantages described above.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A combination of a component conductive tail and a multi-layer circuit board assembly, the circuit board assembly including a bonded stack of a plurality of layers including a topmost layer with a stack top and a bottommost layer with a stack bottom, the circuit board assembly also including walls forming a plurality of formed holes that each extends down from said top and at least partially through a group of said layers that includes at least said topmost layer, at least one of said layers having a face carrying electrical traces thereon, and said walls of said formed holes being plated to form plated holes that each has a hole plating of conductive material that is electrically connected to one of said electrical traces, said plated holes each having a bottom that lies above said stack bottom, said component tails each have an end portion lying in one of said plated holes, and including a quantity of solder that fills each of said plated hole and that has been flowed to lie around and bond to the corresponding tail end portion and to lie against and bond to the corresponding one of said platings, wherein:
    each of said component tails has an extreme lower end that lies a vertical distance from an extreme lower end of the bottom of the corresponding plated hole, and the quantity of solder in each of said plurality of holes each extends from the bottom of the plated hole to above the lower end of the tail.

2. The combination described in claim 1 wherein:
    each of a plurality of said plated holes has a bottom with an extreme lower end that lies within a particular one of said layers and that is spaced above the bottom surface of said particular one of said layers.

3. The combination described in claim 1 wherein:
    each of a plurality of said formed holes and said plated holes has a bottom that is conical, whereby to use drilled holes.

4. The combination described in claim 1 wherein:
    each of a plurality of said plated holes has bottom with an extreme lower end that lies within a particular one of said layers and that is spaced above the bottom surface of said particular one of said layers.

5. The combination described in claim 1 wherein:
    each of a plurality of said plated holes has a bottom that is conical, whereby to use drilled holes.

6. A combination of a component conductive tail and a multi-layer circuit board assembly, the circuit board assembly including a bonded stack of a plurality of layers including a topmost layer with a top, and the circuit board assembly also including walls forming a plurality of formed blind holes that each extends at least partially through a group of said layers that includes at least said topmost layer, said formed blind holes each has a bottom that lies in said board assembly, at least one of said layers having a face carrying electrical traces thereon, and said walls of said formed holes being plated to form plated holes that each has a hole plating of conductive material that is electrically connected to one of said electrical traces, said component tails each have an end portion lying in one of said plated holes, and including a quantity of solder that fills each of said plated hole and that has been flowed to lie around and bond to the corresponding tail end portion and to lie against and bond to the corresponding one of said platings, wherein:
    each of said component tails has an extreme lower end that lies a distance above an extreme lower end of the bottom of the corresponding plated hole, and the quantity of solder in each of said plurality of holes each extends from against the bottom of the plated hole to above the lower end of the tail.

7. A method for constructing a multilayer board assembly and mounting a component tail in the board assembly and in electrical connection with an electrically conductive trace of the assembly, including adhering a plurality of layers together in a stack wherein at least one of said layers has conductive traces including said particular trace, comprising:
    establishing blind holes in said stack wherein said holes each extends through one of said conductive traces, and plating each hole with a conductive plating that lies in electrical contact with the conductive trace that the hole passes through;
    placing a component tail in each of a plurality of said holes and soldering each component tail to the plating of the hole, said step of placing including placing each component tail so its extreme lower end lies a distance above the bottom of the hole, and said step of soldering includes establishing a continuous column of solder in each of said plurality of holes wherein each column of solder extends from against a wall at a bottom of the hole to above the lower end of the corresponding component tail.

8. The method described in claim 7 wherein:
    said step of forming said blind holes comprises drilling holes using a drill, with each hole extending partially through said stack, with the bottom of each hole being conical.

9. The method described in claim 7 wherein:
    each of said layers has flat upper and lower surfaces that lie at corresponding levels;
    at least some of said holes have bottoms with extreme lower ends that lie between the levels of the upper and lower surfaces of one of said layers.

* * * * *